(12) United States Patent
Kumata (10) Patent No.: US 10,025,342 B2
(45) Date of Patent: Jul. 17, 2018

(54) CONTROL CIRCUIT OF POWER GATING AND SEMICONDUCTOR DEVICE

(71) Applicant: Sony Corporation, Tokyo (JP)

(72) Inventor: Ichiro Kumata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/554,535

(22) PCT Filed: Mar. 8, 2016

(86) PCT No.: PCT/JP2016/057163
§ 371 (c)(1),
(2) Date: Aug. 30, 2017

(87) PCT Pub. No.: WO2016/158242
PCT Pub. Date: Oct. 6, 2016

(65) Prior Publication Data
US 2018/0074544 A1   Mar. 15, 2018

(30) Foreign Application Priority Data

Mar. 30, 2015   (JP) .................................. 2015-069108

(51) Int. Cl.
*H03K 19/096* (2006.01)
*G06F 1/04* (2006.01)
*G06F 1/32* (2006.01)
*G06F 9/38* (2018.01)
*H03K 3/037* (2006.01)

(52) U.S. Cl.
CPC .................. *G06F 1/04* (2013.01); *G06F 1/32* (2013.01); *G06F 9/38* (2013.01); *H03K 3/037* (2013.01); *H03K 19/096* (2013.01)

(58) Field of Classification Search
None
See application file for complete search history.

(56) References Cited

U.S. PATENT DOCUMENTS

| | | | | |
|---|---|---|---|---|
| 7,145,365 | B2 * | 12/2006 | Kumata | G06F 9/3869 326/93 |
| 2005/0253462 | A1 * | 11/2005 | Falkowski | H02J 1/14 307/43 |
| 2006/0294399 | A1 * | 12/2006 | Chen | G06F 1/26 713/300 |
| 2010/0005328 | A1 * | 1/2010 | Rakshani | G06F 1/3203 713/322 |

FOREIGN PATENT DOCUMENTS

| | | |
|---|---|---|
| JP | 2002-319852 A | 10/2002 |
| JP | 2005-065044 A | 3/2005 |
| JP | 2007/158505 A | 6/2007 |
| JP | 2012/014845 A | 1/2012 |
| WO | 99/6640 A1 | 12/1999 |

* cited by examiner

*Primary Examiner* — Minh D A
*Assistant Examiner* — James H Cho
(74) *Attorney, Agent, or Firm* — Michael Best & Friedrich LLP

(57) ABSTRACT

A control circuit of power gating of the present disclosure includes a control section that controls whether to perform power gating depending on a level of a clock signal for a logic circuit supplied with a power supply voltage through a power switch transistor, on the basis of a clock frequency of the clock signal.

11 Claims, 9 Drawing Sheets

CONTROL CIRCUIT OF POWER GATING AND SEMICONDUCTOR DEVICE

TECHNICAL FIELD

The disclosure relates to a control circuit of power gating and a semiconductor device.

BACKGROUND ART

In recent years, lower power consumption of a logic circuit used in an electronic apparatus has been desired, as various electronic apparatuses equipped with logic circuits have been mobilized. A logic circuit used for an electronic apparatus is configured of a semiconductor integrated circuit such as a complementary metal oxide semiconductor (CMOS) transistor in many cases. In recent years, CMOS manufacturing processes have been finer, as represented by a reduction in gate width and thinning of oxide films. As the manufacturing processes have thus become finer, a leakage current in a CMOS transistor has increased, and it has been difficult to ignore power consumption caused thereby. As a remedy therefor, there is a technique called power gating that interrupts power supply to a logic circuit in a period in which the logic circuit is not in operation. For example, PTL 1 to PTL 4 each propose a circuit that reduces a leakage current by using the power gating.

CITATION LIST

Patent Literature

PTL 1: Japanese Unexamined Patent Application Publication No. 2005-65044
PTL 2: Japanese Unexamined Patent Application Publication No. 2012-14845
PTL 3: International Publication No. WO 99/66640
PTL 4: Japanese Unexamined Patent Application Publication No. 2002-319852

SUMMARY OF THE INVENTION

PTL 1 proposes a technique of addressing leakage in an operating state, by controlling a power switch transistor for power gating depending on a level of a clock signal for each clock period, when performing power gating for a logic circuit in which a clock frequency is relatively low. In the technique proposed in PTL 1, it is possible to reduce power consumption in a case where the clock frequency is relatively low. When this technique is applied to a system that allows a change in clock frequency, however, there is a possibility that power consumption may increase conversely due to overhead that accompanies switching of power gating in a case where an operation is performed at a relatively-high clock frequency, or that a frequency that allows operation may decrease.

PTL 2 proposes a technique of reducing a leakage current by adjusting a pulse waveform of a clock signal by using a gate delay. In the technique discussed in PTL 2, there is also a possibility that sufficient performance may not be obtained in a case where an operation is performed at a relatively-high clock frequency, as with the above-described technique discussed in PTL 1. Further, since the gate delay is used for timing adjustment of the clock signal, the number of gates increases, and moreover, the number of design processes increases because design including the timing adjustment is not easily handled using an ordinary computer aided design (CAD) tool for synchronization design.

It is therefore desirable to provide a control circuit of power gating and a semiconductor device that make it possible to perform optimum power gating depending on a clock frequency.

A control circuit of power gating according to one embodiment of the disclosure includes a control section that controls whether to perform power gating depending on a level of a clock signal for a logic circuit supplied with a power supply voltage through a power switch transistor, on the basis of a clock frequency of the clock signal.

A semiconductor device according to one embodiment of the disclosure includes: a power switch transistor; a logic circuit to which a power supply voltage is supplied through the power switch transistor, and for which power gating depending on a level of a clock signal is performed; and a control section that controls whether to perform the power gating, on the basis of a clock frequency of the clock signal.

In the control circuit of power gating and the semiconductor device according to the respective embodiments of the disclosure, whether to perform the power gating depending on the level of the clock signal is controlled on the basis of the clock frequency of the clock signal.

According to the control circuit of power gating and the semiconductor device according to the respective embodiments of the disclosure, whether to perform the power gating depending on the level of the clock signal is controlled on the basis of the clock frequency of the clock signal, and therefore, it is possible to perform optimum power gating depending on a clock frequency.

It is to be noted that the effects described above are not necessarily imitative, and any of effects described in the disclosure may be provided.

MODES FOR CARRYING OUT THE INVENTION

Some embodiments of the disclosure will be described below in detail with reference to the drawings. It is to be noted that the description will be provided in the following order.
1. Semiconductor Device Including Control Circuit of Power Gating
   1.1 Configuration (FIG. 1)
   1.2 Operation (FIG. 2 to FIG. 4)
   1.3 Effects
2. Example of Generation of Clock Signal and Clock Power Gating Control Signal
   2.1 First Example (FIG. 5)
   2.2 Second Example (FIG. 6 and FIG. 7)
   2.3 Third Example (FIG. 8 to FIG. 12)
3. Other Embodiments

1. Semiconductor Device Including Control Circuit of Power Gating

1.1 Configuration

Figure 1:
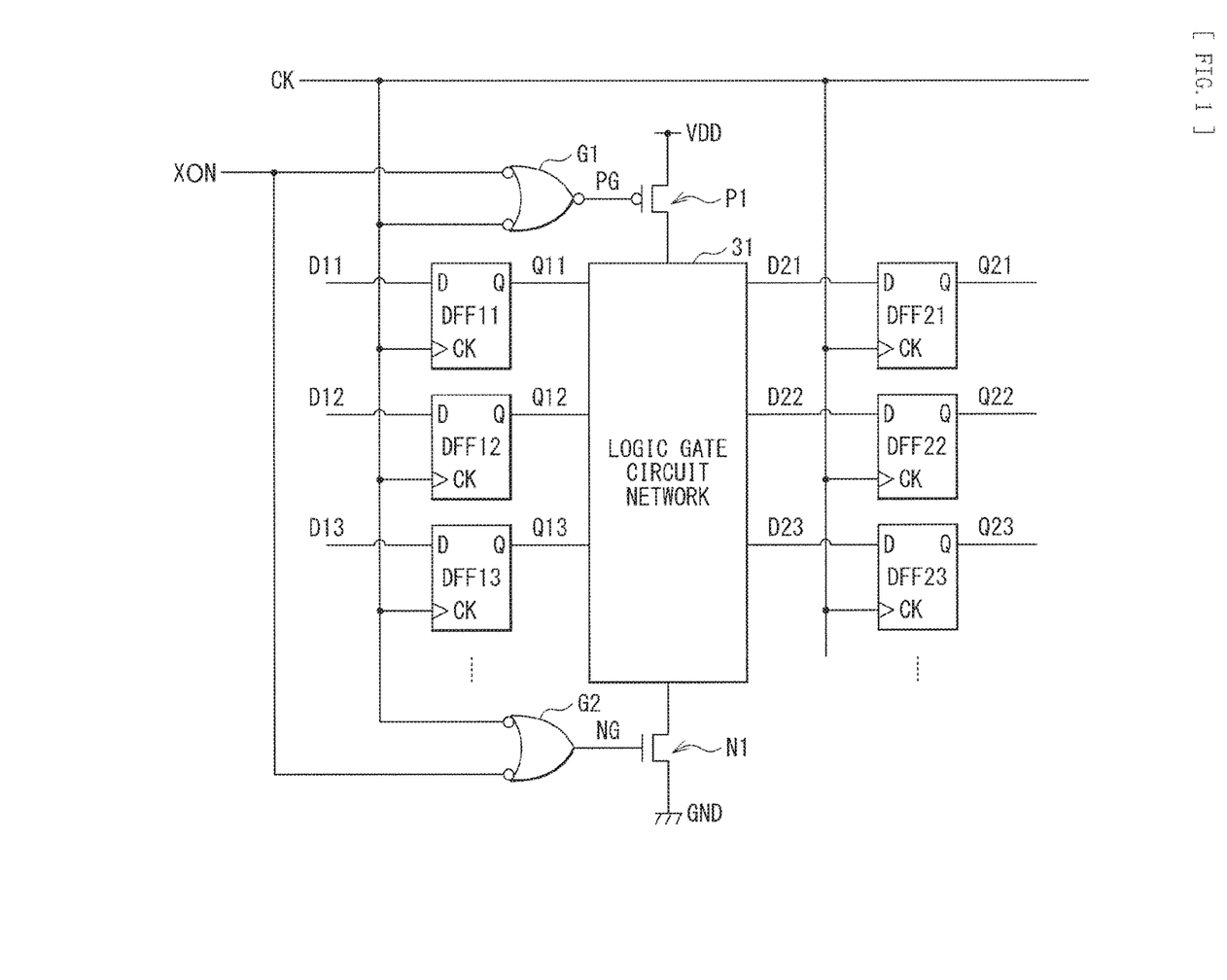
FIG. 1 is a circuit diagram illustrating a configuration example of a semiconductor device including a control circuit of power gating according to an embodiment of the disclosure.

FIG. 1 illustrates a configuration example of a semiconductor device including a control circuit of power gating according to an embodiment of the disclosure.

The semiconductor device according to the present embodiment includes a logic gate circuit network 31 as a logic circuit, and a plurality of D-type flip-flops (DFFs). As the DFFs, there are provided a plurality of DEFs, i.e., DFF 11, DFF 12, DFF 13, and so on, disposed in a stage preceding the logic gate circuit network 31, and a plurality of DEFs, i.e., DFF 21, DFF 22, DFF 23, and so on, disposed in a stage following the logic gate circuit network 31. It is to be noted that a JK master-slave-type flip-flop, etc. may be coupled to the logic gate circuit network 31.

Data D11, D12, D13, and so on are inputted from outside to D terminals of the respective DFF 11, DFF 12, DFF 13, and so on, and a clock signal CK is inputted to each of clock terminals thereof. Data Q11, Q12, Q13, and so on are outputted from Q terminals of the respective DFF 11, DFF 12, DFF 13, and so on. Data D21 D22, D23, and so on from the logic gate circuit network 31 are inputted to D terminals of the respective DFF 21, DFF 22, DFF 23, and so on, and the clock signal CK is inputted to each of clock terminals thereof. Data Q21, Q22, Q23, and so on are outputted from Q terminals of the respective DFF 21, DFF 22, DFF 23, and so on.

The semiconductor device further includes power switch transistors P1 and N1 for power gating for the logic gate circuit network 31. The semiconductor device further includes an AND gate G1 and a NAND gate G2.

The power switch transistor P1 includes a pMOS transistor. The power switch transistor P1 is coupled to a power supply voltage VDD. An ON/OFF state of the power switch transistor P1 is controlled through the AND gate G1.

The power switch transistor N1 includes an nMOS transistor. The power switch transistor N1 is coupled to a ground voltage GND. An ON/OFF state of the power switch transistor N1 is controlled through the NAND gate G2.

The DFF 11, DFF 12, DFF 13, and so on as well as the DFF 21, DFF 22, DFF 23, and so on are constantly supplied with the power supply voltage VDD. It is possible to supply the power supply voltage VDD to the logic gate circuit network 31, through the power switch transistors P1 and N1.

It is to be noted that, in the circuit example in FIG. 1, the power switch transistor P1 on the power supply voltage VDD side and the power switch transistor N1 on the ground voltage GND side are both used, but only one of these power switch transistors may be used, and the other may be omitted. In this case, the AND gate G1 or the NAND gate G2 coupled to the other power switch transistor is unnecessary. In addition, in this case, one of the power supply voltage VDD and the ground voltage GND is directly coupled to the logic gate circuit network 31 without a power switch transistor.

The AND gate G1 and the NAND gate G2 have a function as a control section that controls whether to perform the power gating depending on a level of the clock signal CK for the logic gate circuit network 31, on the basis of a clock frequency of the clock signal CK. The clock signal CK and a clock power gating control signal XON are to be inputted to the AND gate G1 and the NAND gate G2.

1.2 Operation

Figure 2:
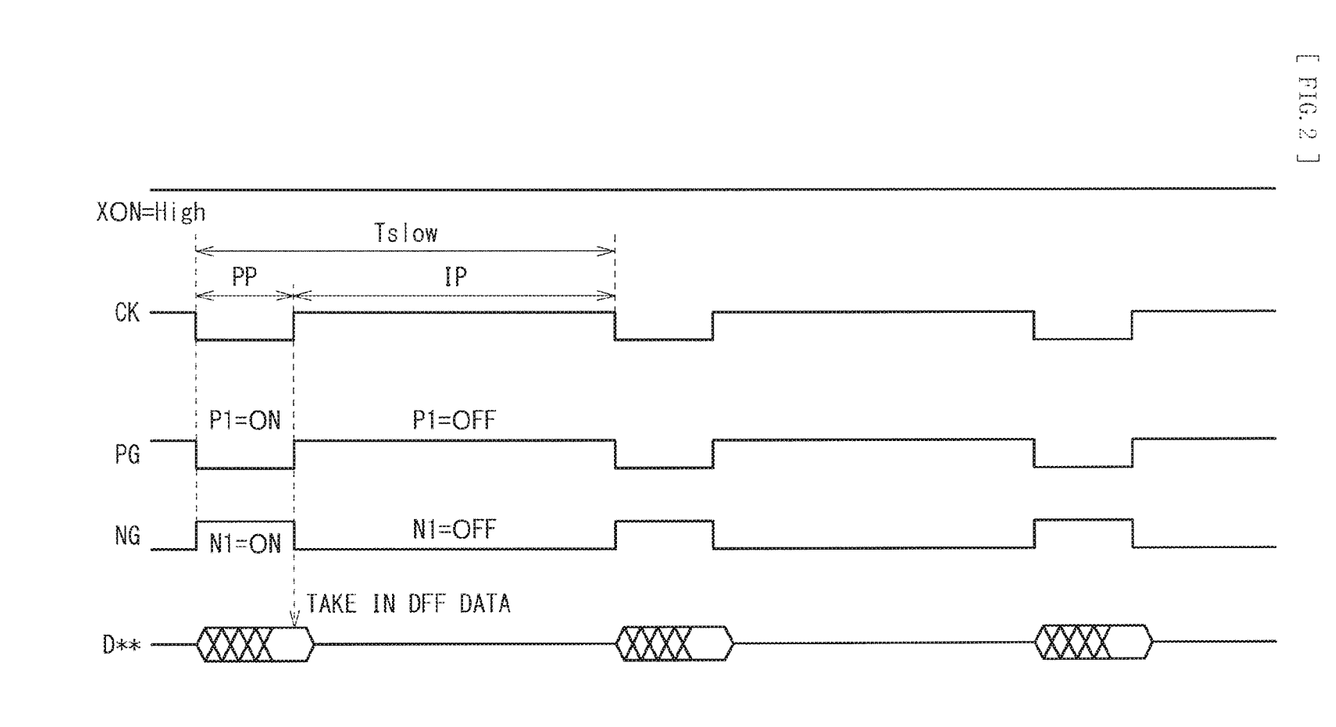
FIG. 2 is a timing chart illustrating an example of an operation in a case where a clock power gating control signal XON is High, in the semiconductor device illustrated in FIG. 1.
Figure 3:
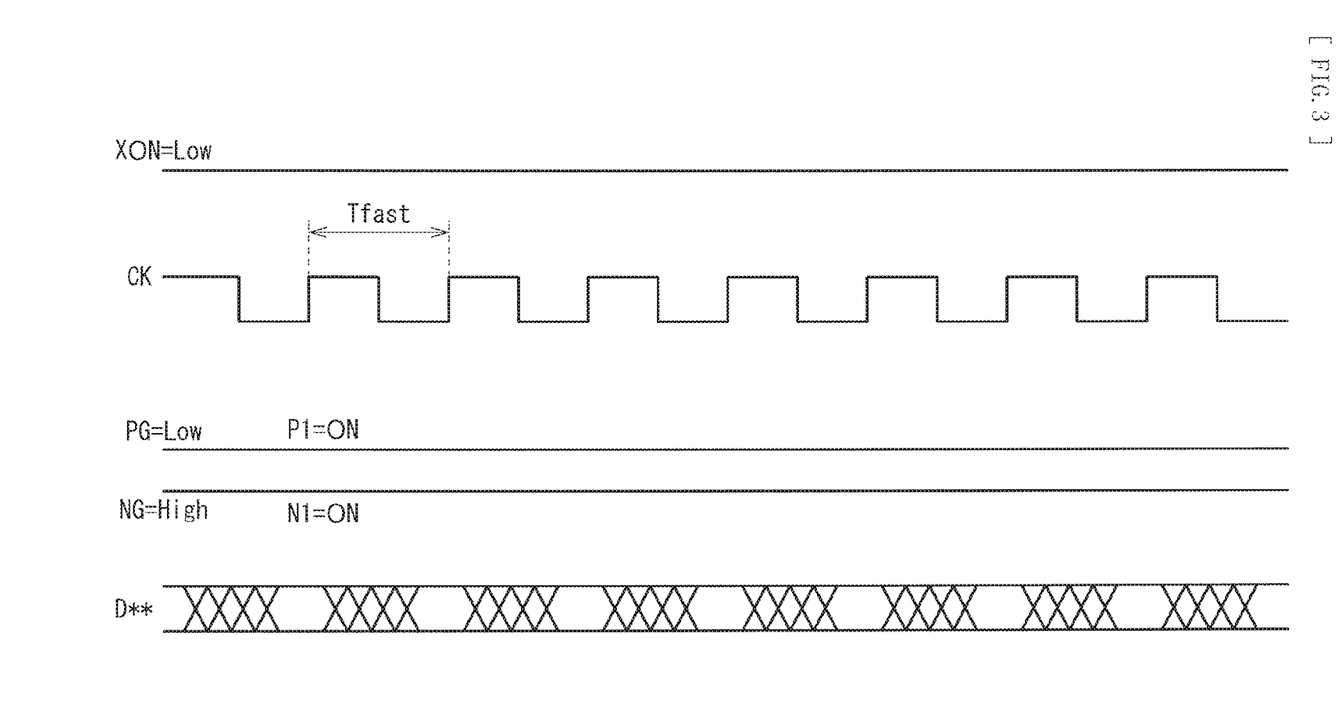
FIG. 3 is a timing chart illustrating an example of an operation in a case where the clock power gating control signal XON is Low, in the semiconductor device illustrated in FIG. 1.
Figure 4:
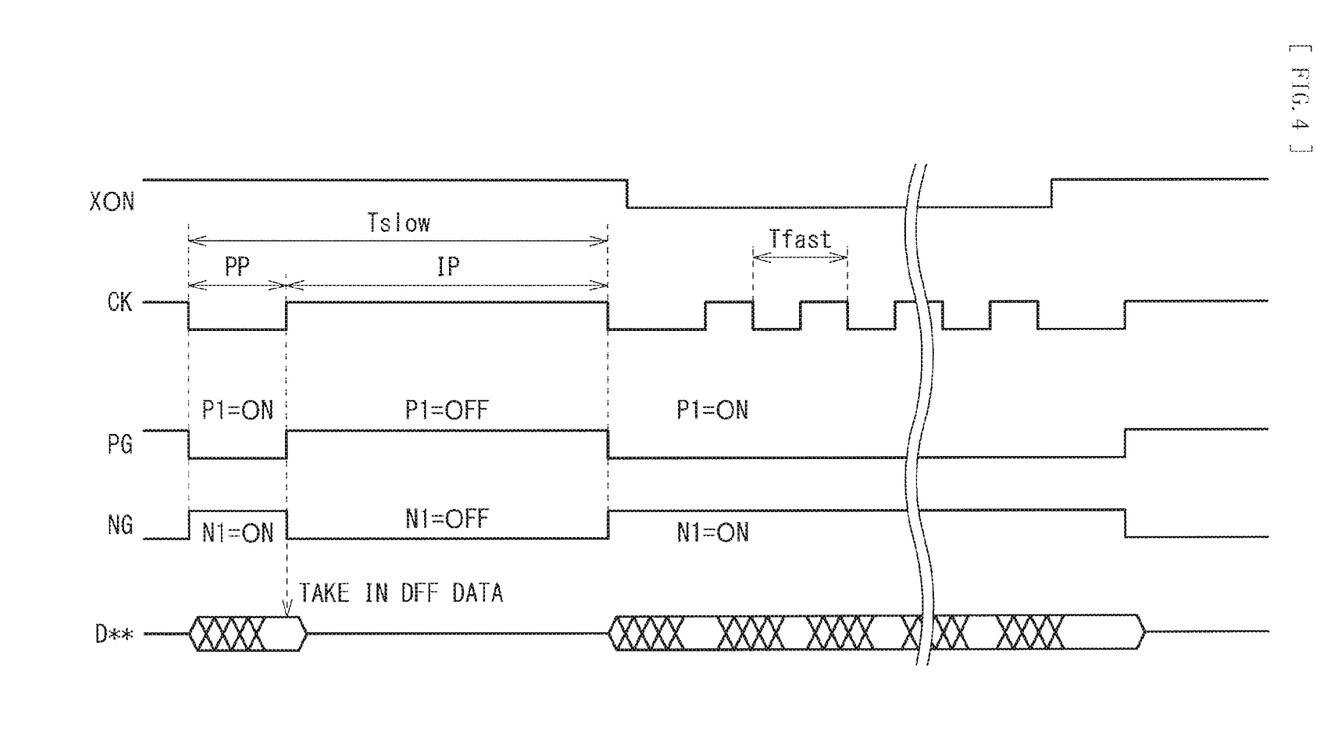
FIG. 4 is a timing chart illustrating an example of an operation in a case where a signal level of the clock power gating control signal XON is switched, in the semiconductor device illustrated in FIG. 1.

A control operation of the power gating in the semiconductor device according to the present embodiment will be described with reference to FIG. 2 to FIG. 4. FIG. 2 illustrates an example of an operation in a case where the clock power gating control signal XON is High. FIG. 3 illustrates an example of an operation in a case where the clock power gating control signal XON is Low. FIG. 4 illustrates an example of an operation in a case where a signal level of the clock power gating control signal XON is switched.

In FIG. 2 to FIG. 4, D indicates a signal waveform at the D terminal or the Q terminal of each of the DFFs in FIG. 1. PG indicates a waveform of a signal outputted from the AND gate G1. NG indicates a waveform of a signal outputted from the NAND gate G2. PP (Power Gated Period) indicates a power gate period. IP (Idle Period) indicates an idle period. Tslow indicates a clock period in a case where the clock frequency of the clock signal CK is a first frequency that is low. Tfast indicates a clock period in a case where the clock frequency is a second frequency higher than the first frequency. In the D, mesh display indicates that a result of data processing is in an uncertain state.

In a case where the clock frequency of the clock signal CK is the first frequency that is low, the AND gate G1 and the NAND gate G2 control the power switch transistors P1 and N1 to switch between the ON state and the OFF state depending on the level of the clock signal CK, thereby causing the power gating to be performed for the logic gate circuit network 31. In this case, the AND gate G1 and the NAND gate G2 are supplied with a signal having a signal level that is High, as the clock power gating control signal XON, as illustrated in FIG. 2 and FIG. 4.

In a case where the power gating is performed, a timing at which the power supply voltage VDD is supplied to the logic gate circuit network 31 is determined by the level of the clock signal CK. In a section of the PP in which the clock signal CK is at an L level, the power switch transistors P1 and N1 are ON, so that the logic gate circuit network 31 operates, and a result thereof is taken into the DFFs. In a section of the IP in which the clock signal CK is at an H level, the power switch transistors P1 and N1 are OFF, so that a leakage current is reduced.

In the DFF 11, DFF 12, DFF 13, and so on and the DFF 21, DFF 22, DFF 23, and so on, the data D11, D12, D13, and so on from the outside and the data D21, D22, D23, and so on representing a processing result from the logic gate circuit network 31 are held (taken in), at a rise time of the clock signal CK. In the period in which the clock signal CK is at the L level, the power supply voltage VDD is supplied to the logic gate circuit network 31.

In the case where the power gating is performed, in the period in which the clock signal CK is at the L level, the power switch transistor P1 and the power switch transistor N1 are in the ON state. At this time, in the logic gate circuit network 31, the data D11, D12, D13, and so on held and outputted from the DFF 11, DFF 12, DFF 13, and so on disposed in the preceding stage are being processed, and results thereof are also to be held in the DFF 21, DFF 22, DFF 23, and so on disposed in the following stage, at the next rise time of the clock signal CK.

On the other hand, in a case where the clock frequency of the clock signal CK is the second frequency that is higher than the first frequency, the AND gate G1 and the NAND gate G2 control the power switch transistors P1 and N1 to constantly remain in the ON state regardless of the level of the clock signal CK, thereby preventing the power gating from being performed for the logic gate circuit network 31. In this case, the AND gate G1 and the NAND gate G2 are provided with a signal having a signal level that is Low, as the clock power gating control signal XON, as illustrated in FIG. 3 and FIG. 4.

1.3 Effects

As described above, according to the present embodiment, whether to perform the power gating depending on the level of the clock signal CK is controlled on the basis of the clock frequency of the clock signal CK, and it is therefore possible to perform optimum power gating depending on a clock frequency.

According to the present embodiment, in the case where the clock power gating control signal XON is High, the frequency of the clock signal CK allowing the operation drops, but it is possible to reduce leakage power because the power gating is performed in each clock period. On the other hand, in the case where the clock power gating control signal XON is Low, the power gating is not performed for each clock period, and it is therefore possible to allow the operation at a high clock frequency, without inviting an increase in power consumption or a decline in operation-allowing frequency.

It is to be noted that the effects described herein are mere examples without being limitative, and other effects may also be provided. This holds true for the following description.

2. Example of Generation of Clock Signal and Clock Power Gating Control Signal Next, examples of generation of the clock signal CK and the clock power gating control signal XON will be described.

2.1 First Example

Figure 5:
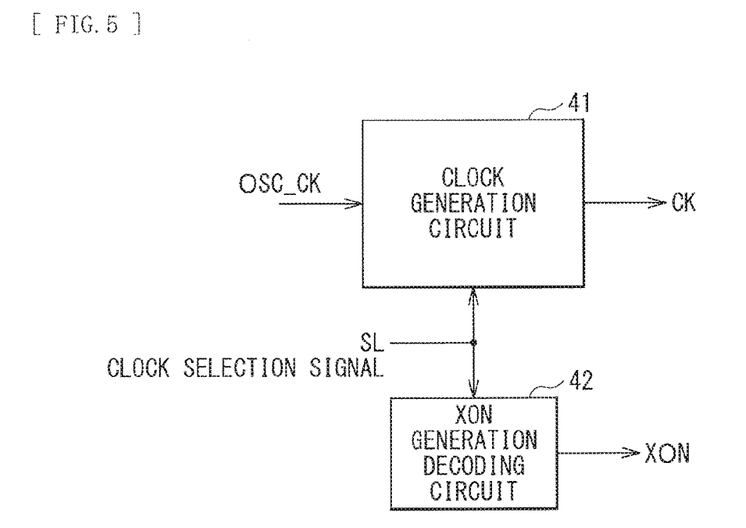
FIG. 5 is a circuit diagram illustrating a first example of a technique of generating a clock signal and a clock power gating control signal.

FIG. 5 illustrates a first example of a technique of generating the clock signal CK and the clock power gating control signal XON.

In this first example, the clock signal CK and the clock power gating control signal XON are generated by a clock generation circuit 41 and an XON generation decoding circuit 42.

The XON generation decoding circuit 42 corresponds to a specific example of a "control signal generation circuit" in the disclosure.

In the clock generation circuit 41, on the basis of a clock selection signal SL, the clock signal CK having the clock frequency that is either the first frequency or the second frequency is generated from a reference clock signal OSC_CK supplied from outside, and the generated clock signal CK is outputted. The XON generation decoding circuit 42 generates the clock power gating control signal XON on the basis of the clock selection signal SL, and outputs the generated clock power gating control signal XON to the AND gate G1 and the NAND gate G2. The XON generation decoding circuit 42 outputs, as the clock power gating control signal XON, a High or Low value predetermined with respect to a clock frequency selected by the clock selection signal SL.

2.2 Second Example

Figure 6:
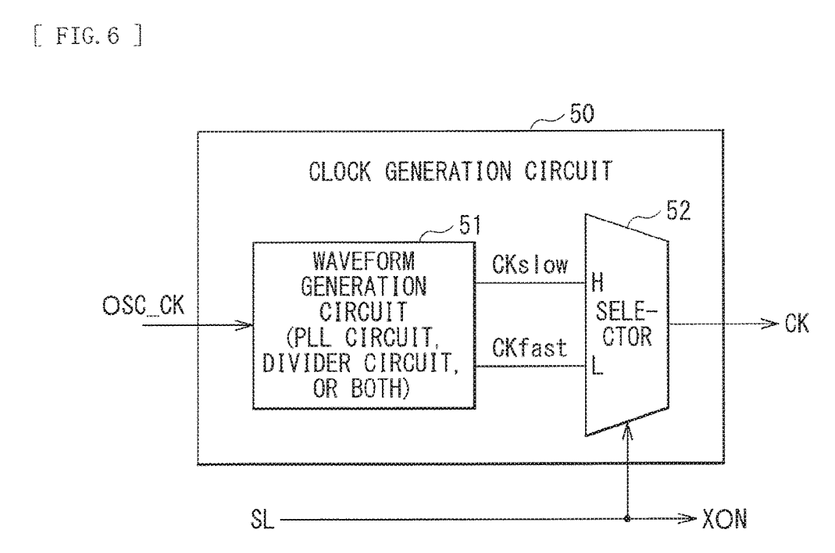
FIG. 6 is a circuit diagram illustrating a second example of the technique of generating the clock signal and the clock power gating control signal.

FIG. 6 illustrates a second example of the technique of generating the clock signal CK and the clock power gating control signal XON.

In this second example, the clock signal CK is generated by a clock generation circuit 50 having a waveform generation circuit 51 and a selector 52. In addition, in this second example, the clock selection signal SL is directly outputted to the AND gate G1 and the NAND gate G2, as the clock power gating control signal XON.

The waveform generation circuit 51 is configured of a PLL (Phase Locked Loop) circuit or a divider circuit. The waveform generation circuit 51 may have a circuit configuration in which the PLL circuit and the divider circuit are used together.

In the clock generation circuit 50, on the basis of the clock selection signal SL, the clock signal CK having the clock frequency that is either the first frequency or the second frequency is generated from the reference clock signal OSC_CK supplied from outside, and the generated clock signal CK is outputted. In the waveform generation circuit 51, the reference clock signal OSC_CK is divided or waveform-shaped, for example, and thereby, two kinds of clock signals CK are generated and outputted to the selector 52. Generated as the two kinds of clock signals CK are a low-speed clock signal CKslow having the clock frequency that is the first frequency and a high-speed clock signal CKfast having the clock frequency that is the second frequency. The selector 52 selects the high-speed clock signal CKfast in a case where the clock selection signal SL is Low, and selects the low-speed clock signal CKslow in a case where the clock selection signal SL is High, and then outputs the selected signal as the clock signal CK.

Figure 7:
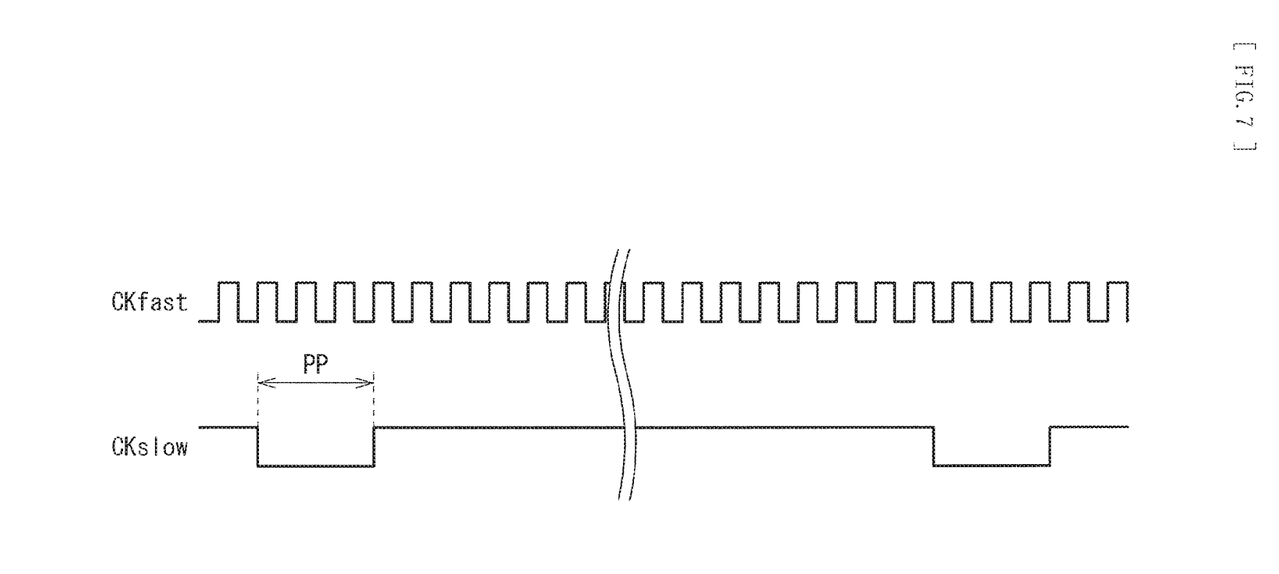
FIG. 7 is a timing chart illustrating an example of each of a low-speed clock signal and a high-speed clock signal.

FIG. 7 illustrates an example of each of the low-speed clock signal CKslow and the high-speed clock signal CKfast. The high-speed clock signal CKfast is used in a case where the power gating is not performed for each clock period. The low-speed clock signal CKslow is used in a case where the power gating is performed for each clock period.

When the power is turned on or off for each clock period, accompanying switching therebetween, the power switch transistors P1 and N1 are driven, and overhead of power consumption occurs due to through current in the logic gate circuit network 31 at power-on. Whether to perform the power gating is highly likely to be determined in a case where a frequency ratio between the clock frequency of the high-speed clock signal CKfast and the clock frequency of the low-speed clock signal CKslow is a large value such as 100 times and 1,000 times. In such a case, when the high-speed clock signal CKfast is divided by an ordinary divider circuit and the low-speed clock signal CKslow of a duty ratio of about 50% is generated and used, a power-supply ON period (a period of the PP) becomes longer than necessary, which makes a leakage-current reduction effect insufficient. It is therefore preferable to use such a divider circuit that a pulse width (a pulse width at the L level) on side where the power-supply ON period (the period of the PP) is defined by the low-speed clock signal CKslow is a time width which includes an appropriate margin and is larger than a time width at which the logic gate circuit network 31 operates after power-on and then the DFFs in the next stage are allowed to receive a correct result. In addition, it is preferable that the pulse width at the L level of the low-speed clock signal CKslow be smaller than a pulse width at the H level.

2.3 Third Example

Figure 8:
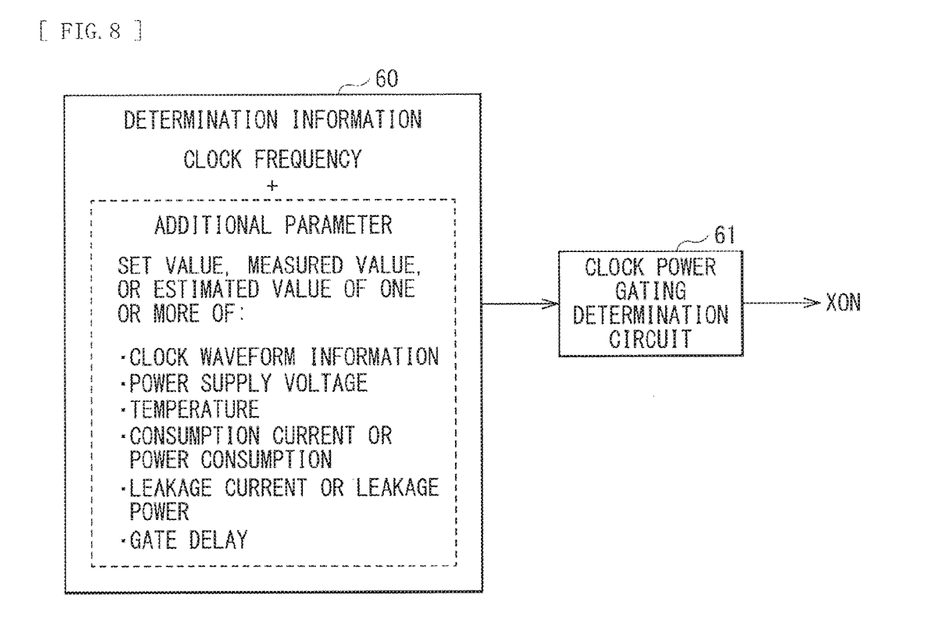
FIG. 8 is a circuit diagram illustrating a third example of the technique of generating the clock signal and the clock power gating control signal.

FIG. 8 illustrates a third example of the technique of generating the clock signal CK and the clock power gating control signal XON.

In this third example, the clock signal CK may be generated using, for example, the above-described clock generation circuit 50 in FIG. 6. Further, in this third example, the clock power gating control signal XON is generated in a clock power gating determination circuit 61, on the basis of determination information 60.

The determination information 60 may include information on a clock frequency, and an additional parameter. Whether power consumption of a circuit decreases owing to the power gating by the clock signal CK changes depending on not only a clock frequency, but also parameters such as a clock waveform of the clock signal CK, a power supply voltage, temperature of the logic gate circuit network 31, a consumption current or power consumption of the logic gate circuit network 31, a leakage current or leakage power of the logic gate circuit network 31, and a gate delay of the logic gate circuit network 31. Hence, the determination information 60 may include, as the additional parameter, information indicating a set value, a measured value, or an estimated value of one or more of the clock waveform of the clock signal CK, the power supply voltage, the temperature of the logic gate circuit network 31, the consumption current or power consumption of the logic gate circuit network 31, the leakage current or leakage power of the logic gate circuit network 31, and the gate delay of the logic gate circuit network 31.

On the basis of the determination information 60, the clock power gating determination circuit 61 determines whether the power gating is possible, and whether the power consumption decreases in a case where the power gating is performed. In a case where the clock power gating determination circuit 61 determines that the power gating is possible and the power consumption decreases, the clock power gating determination circuit 61 outputs the clock power gating control signal XON that orders execution of the power gating.

It is to be noted that, as for an algorithm of the determination in the clock power gating determination circuit 61, a value indicating a reduction in power consumption owing to the clock power gating may be determined by calculation, or a numerical value table, in which determination values for parameter values decided by simulation, prototype measurement, etc. are recorded and which is stored in a system, may be utilized.

Figure 9:
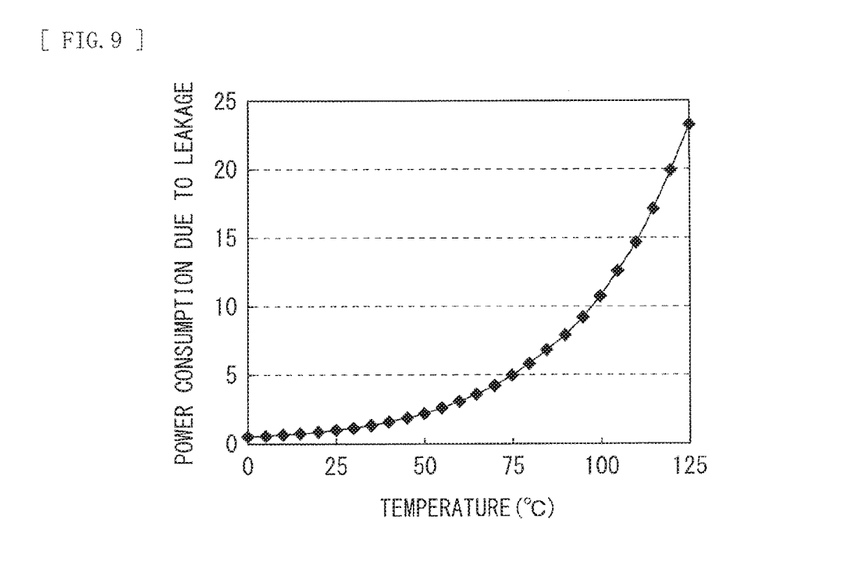
FIG. 9 is a characteristic diagram illustrating an example of a relationship between temperature and power consumption due to leakage.
Figure 10:
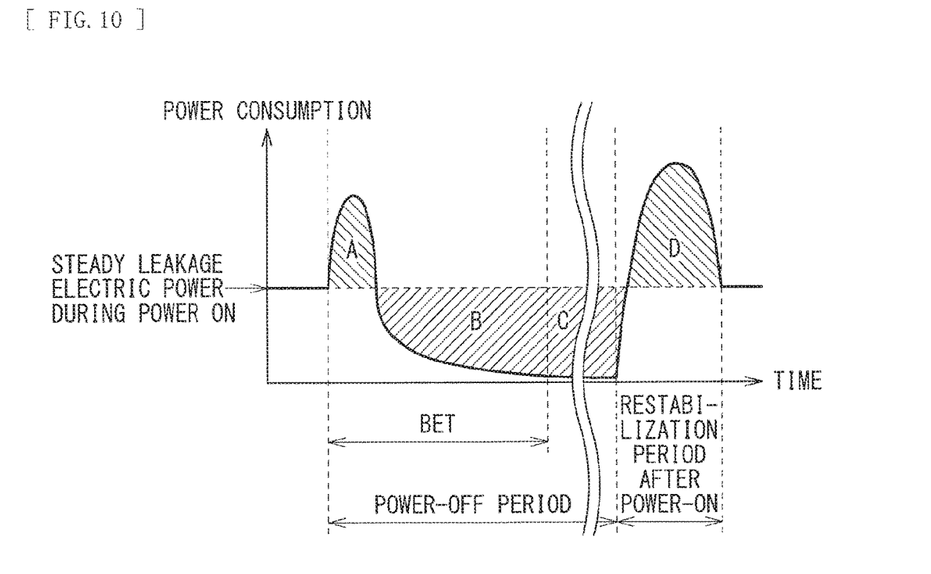
FIG. 10 is a characteristic diagram illustrating an example of a power-consumption transition accompanying switching between power ON and power OFF.
Figure 11:
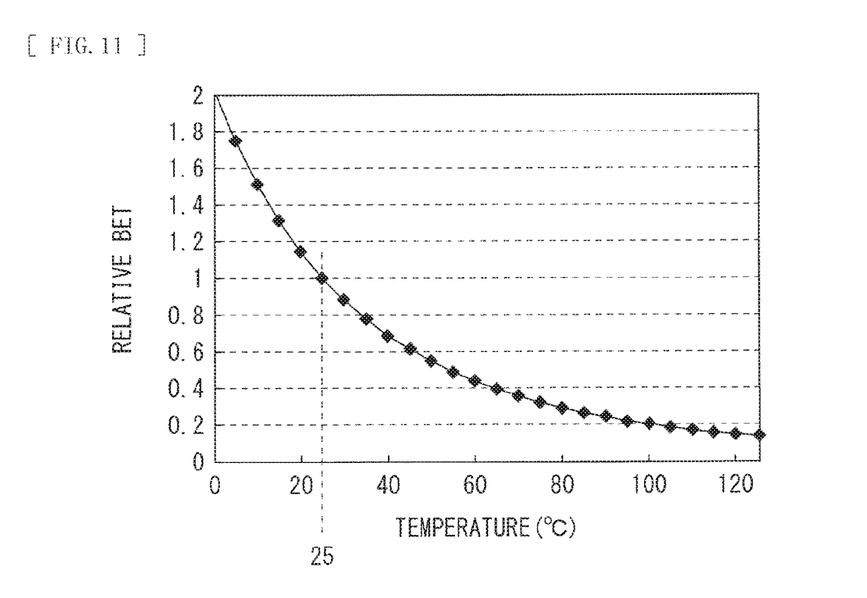
FIG. 11 is a characteristic diagram illustrating an example of a relationship between temperature and relative BET with a value at 25° C. as a reference.
Figure 12:
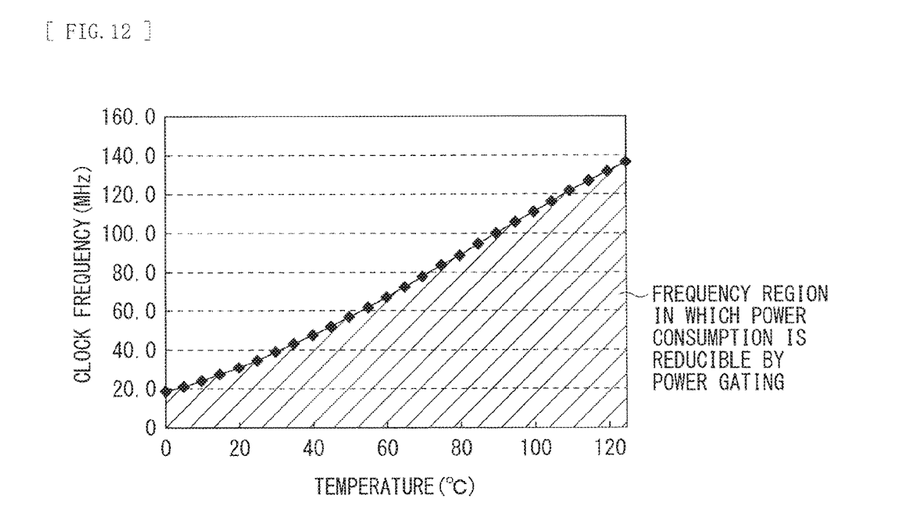
FIG. 12 is a characteristic diagram illustrating an example of a relationship between temperature at which power consumption is reducible by power gating and a clock frequency.

An example of a determination method assuming temperature and a clock frequency (a clock waveform) to be parameters will be described as a specific example, with reference to FIG. 9 to FIG. 12. FIG. 9 illustrates an example of a relationship between temperature and power consumption due to leakage with a value at 25° C. as a reference. FIG. 10 illustrates an example of a power-consumption transition accompanying switching between power ON and power OFF. FIG. 11 illustrates an example of a relationship between temperature and relative BET (Break Even Time) with a value at 25° C. as a reference. FIG. 12 illustrates an example of a relationship between temperature at which power consumption is reducible by power gating and a clock frequency.

It is known that power consumption due to LSI (Large Scale Integration) leakage almost exponentially increases as temperature rises, as illustrated in FIG. 9. Hence, an effect of a power consumption reduction in a case where a power supply of the logic gate circuit network 31 is OFF is larger, as circuit temperature is higher.

To be considered here is an effect of a consumption current reduction in a case where the power gating is performed as illustrated in FIG. 2, and the power supply of the logic gate circuit network 31 is controlled to be ON/OFF. Immediately after the power supply is changed from ON to OFF, electric power is consumed to drive the power switch transistors P1 and N1 illustrated in FIG. 1. The area A indicates this power consumption in FIG. 10. Furthermore, immediately after the power supply is changed from OFF to ON, in addition to the electric power for driving of the power switch transistors P1 and N1, power consumption occurs due to a charge/discharge current, a through current, etc. within the logic gate circuit network 31 in a period before the logic gate circuit network 31 becomes stable after power-on. The area D indicates this power consumption in FIG. 10.

When a boundary of B representing a power-supply OFF period is set to have the area A±the area D=the area B, a leakage-power reduction amount in a period indicated by BET equals a power-consumption increase amount due to power ON/OFF. It is therefore possible to reduce the power consumption as a whole, in a case where the power-supply OFF period is longer than the BET. The reduction amount is expressed by the area C in FIG. 10, and the reduction amount is larger, as one power-supply OFF period is longer.

A value corresponding to the temperature of this BET may be determined by power consumption measurement of a prototype circuit, or may be determined by simulation, a model expression, etc. The model expression is provided in, for example, "ISQED symposium 2010" by Usami et al. FIG. 11 illustrates a graph example of BET determined from such a model expression, in a case where 25° C. is assumed to be 1.

Next, a clock frequency to be a boundary condition is considered from the BET.

Assuming the power-supply OFF period=BET in FIG. 2, one period of the clock signal CK is BET+PP (the power-supply ON period). It is necessary for the PP to be greater than "re-stabilization time after power-on+delay time necessary for logic circuit to perform computation" in FIG. 2, but a change with respect to temperature is relatively small. It is therefore possible to add a margin to some extent, thereby achieving a uniform width without depending on the frequency, the temperature, etc. Therefore, FIG. 12 illustrates, as an example, a graph of temperatures and boundary frequencies calculated from the graph in FIG. 11, assuming that an operating frequency in a mode of not performing the power gating for each clock period is 1 GHz, BET=25 nsec at 25° C. and PP=4 ns. In this example, it is possible to reduce power consumption in a region on lower right side of the boundary frequencies.

In a case where determination based on a clock waveform (or a frequency) and temperature in the circuit illustrated in FIG. 8 is performed in the above-described example, the clock power gating determination circuit 61 may be a determination circuit using a determination expression or a numerical value table equivalent to or approximate to FIG. 12, and the clock power gating control signal XON may be thereby generated.

3. Other Embodiments

The technology according to the disclosure is not limited to the description of the above-described embodiment, and is variously modifiable.

For example, the technology may adopt the following configurations.

(1)

A control circuit of power gating, the control circuit including a control section that controls whether to perform power gating depending on a level of a clock signal for a logic circuit supplied with a power supply voltage through a power switch transistor, on the basis of a clock frequency of the clock signal.

(2)

The control circuit of power gating according to (1), in which the control section causes the power gating to be performed for the logic circuit, by controlling the power switch transistor to switch between an ON state and an OFF state depending on the level of the clock signal, in a case where the clock frequency is a first frequency, and prevents the power gating from being performed for the logic circuit, by controlling the power switch transistor to constantly remain in the ON state regardless of the level of the clock signal, in a case where the clock frequency is a second frequency higher than the first frequency.

(3)

The control circuit of power gating according to (2), further including:

a clock generation circuit that outputs the clock signal having the clock frequency that is one of the first frequency and the second frequency, on the basis of a clock selection signal; and a control signal generation circuit that generates a control signal that controls whether to perform the power gating and outputs the generated control signal to the control section, on the basis of the clock selection signal.

(4)

The control circuit of power gating according to (2), further including a clock generation circuit that outputs the clock signal having the clock frequency that is one of the first frequency and the second frequency, on the basis of a clock selection signal, in which the clock selection signal is inputted to the control section, as a control signal that controls whether to perform the power gating.

(5)

The control circuit of power gating according to (2), further including a determination circuit that determines, on the basis of information indicating one or more of a clock waveform of the clock signal, the power supply voltage, temperature of the logic circuit, a consumption current or power consumption of the logic circuit, a leakage current or leakage power of the logic circuit, and a gate delay of the logic circuit, and information indicating the clock frequency, whether the power gating is possible, and whether the power consumption decreases in a case where the power gating is performed.

(6)

The control circuit of power gating according to (5), in which the determination circuit outputs, to the control section, a control signal that orders execution of the power gating, in a case where the determination circuit determines that the power gating is possible, and the power consumption decreases.

(7)

A semiconductor device including:

a power switch transistor;

a logic circuit to which a power supply voltage is supplied through the power switch transistor, and for which power gating depending on a level of a clock signal is performed; and a control section that controls whether to perform the power gating, on the basis of a clock frequency of the clock signal.

The present application is based on and claims priority from Japanese Patent Application No. 2015-069108 filed in the Japan Patent Office on Mar. 30, 2015, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A semiconductor circuit comprising:
control circuitry configured to perform power gating for a logic circuit, the logic circuit being supplied with a power supply voltage through a power switch transistor depending upon a level of a clock signal when a power gating is performed; and
a control signal generation circuit that outputs a control signal to the control circuitry, the control signal controlling whether the control circuitry performs the power gating, the control signal being dependent upon whether the clock signal is at a first frequency or a second frequency that is higher than the first frequency,
wherein the control circuitry receives the control signal and causes the power gating to be performed for the logic circuit when the clock signal is at the first frequency, and prevents the power gating from being performed when the clock signal is at the second frequency.

2. The semiconductor circuit according to claim 1, wherein the control circuitry causes the power gating to be performed by controlling the power switch transistor to switch between an ON state and an OFF state depending on the level of the clock signal, in a case where the clock frequency is the first frequency.

3. The semiconductor circuit according to claim 2, further comprising:
a clock generation circuit that outputs the clock signal to have the first frequency or the second frequency, on a basis of a clock selection signal.

4. The semiconductor circuit according to claim 2, further comprising:
a determination circuit that determines whether the power gating is to be performed based upon one or more of a clock waveform of the clock signal, the power supply voltage, temperature of the logic circuit, a consumption current or power consumption of the logic circuit, a leakage current or leakage power of the logic circuit, or a gate delay of the logic circuit.

5. The semiconductor circuit according to claim 4, wherein the determination circuit prompts the output of the control signal to the control circuitry to order execution of the power gating, in a case where the determination circuit determines that the power gating is to be performed.

6. A control circuit of power gating, comprising:
control circuitry configured to control whether to perform power gating depending on a level of a clock signal for a logic circuit supplied with a power supply voltage through a power switch transistor, on a basis of a clock frequency of the clock signal,
wherein the control circuitry
causes the power gating to be performed for the logic circuit, by controlling the power switch transistor to switch between an ON state and an OFF state depending on the level of the clock signal, in a case where the clock frequency is a first frequency, and
prevents the power gating from being performed for the logic circuit, by controlling the power switch transistor to constantly remain in the ON state regardless of the level of the clock signal, in a case where the clock frequency is a second frequency higher than the first frequency.

7. The control circuit of power gating according to claim 6, further comprising:
a clock generation circuit that outputs the clock signal having the clock frequency that is one of the first frequency and the second frequency, on a basis of a clock selection signal; and
a control signal generation circuit that generates a control signal that controls whether to perform the power gating and outputs the generated control signal to the control circuitry, on the basis of the clock selection signal.

8. The control circuit of power gating according to claim 6, further comprising
a clock generation circuit that outputs the clock signal having the clock frequency that is one of the first frequency and the second frequency, on a basis of a clock selection signal, wherein
the clock selection signal is inputted to the control circuitry, as a control signal that controls whether to perform the power gating.

9. The control circuit of power gating according to claim 6, further comprising a determination circuit that determines, on a basis of information indicating one or more of a clock waveform of the clock signal, the power supply voltage, temperature of the logic circuit, a consumption current or power consumption of the logic circuit, a leakage current or leakage power of the logic circuit, and a gate delay of the logic circuit, and information indicating the clock frequency, whether the power gating is possible, and whether the power consumption decreases in a case where the power gating is performed.

10. The control circuit of power gating according to claim 9, wherein the determination circuit outputs, to the control circuitry, a control signal that orders execution of the power gating, in a case where the determination circuit determines that the power gating is possible, and the power consumption decreases.

11. A semiconductor device comprising:
a power switch transistor;
a logic circuit to which a power supply voltage is supplied through the power switch transistor, and for which power gating depending on a level of a clock signal is performed;
control circuitry configured to perform the power gating for the logic circuit, the logic circuit being supplied with the power supply voltage through the power switch transistor depending upon the level of the clock signal when the power gating is performed; and
a control signal generation circuit that outputs a control signal to the control circuitry, the control signal controlling whether the control circuitry performs the power gating, the control signal being dependent upon whether the clock signal is at a first frequency or a second frequency that is higher than the first frequency,
wherein the control circuitry receives the control signal and causes the power gating to be performed for the logic circuit when the clock signal is at the first frequency, and prevents the power gating from being performed when the clock signal is at the second frequency.

* * * * *